United States Patent [19]

Kyle

[11] Patent Number: 5,234,970
[45] Date of Patent: Aug. 10, 1993

[54] DUAL CURING COMPOSITION BASED ON ISOCYANATE TRIMER AND USE THEREOF

[75] Inventor: David R. Kyle, Columbia, Md.

[73] Assignee: W. R. Grace & Co.-Conn., New York, N.Y.

[21] Appl. No.: 811,417

[22] Filed: Dec. 20, 1991

Related U.S. Application Data

[63] Continuation-in-part of Ser. No. 730,421, Jul. 16, 1991, abandoned.

[51] Int. Cl.$^5$ .................. C08F 2/50; C08F 26/06; C08G 18/75; C08G 18/81
[52] U.S. Cl. ..................... 522/96; 522/174; 526/258; 528/75; 428/901
[58] Field of Search .................. 522/96, 174; 526/258, 526/310; 428/901; 528/59, 69, 75

[56] References Cited

U.S. PATENT DOCUMENTS 3,891,523 6/1975 Hisamatsu et al. .................. 522/96
4,138,299 2/1979 Bolgiano .............................. 522/96

Primary Examiner—Marion E. McCamish
Assistant Examiner—Susan Berman
Attorney, Agent, or Firm—Valerie E. Looper

[57] ABSTRACT

A dual curing composition is prepared from components consisting essentially of (a) an isocyanate adduct having (i) free isocyanate groups and (ii) free photopolymerizable ethylenically unsaturated groups, wherein the ethylenically unsaturated groups comprise in the range of 10 to 70% of the total of any free functional groups on said adduct;
(b) reactive (meth)acrylate diluents; and
(c) optionally, photoinitiator.

When cured, the above composition is particularly suitable as a conformal coating on electronic circuit boards.

3 Claims, No Drawings

DUAL CURING COMPOSITION BASED ON ISOCYANATE TRIMER AND USE THEREOF

This application is a continuation-in-part of U.S. Ser. No. 730,421, filed Jul. 16, 1991, now abandoned, which is incorporated by reference.

FIELD OF THE INVENTION

This invention relates generally to dual curing compositions and methods of using those compositions, and specifically relates to dual curing conformal coatings. By "conformal coating", it is meant a coating which is applied so as to conform to the features of the surface to be coated, especially surfaces of electronic circuit boards. By "dual curing", it is meant that the curing occurs through two mechanisms.

BACKGROUND OF THE INVENTION

Conformal coatings were originally made to protect military and aerospace electronic assemblies from environmental factors such as humidity, dust and chemical contaminants. These environmental factors cause unprotected assemblies with delicate circuitry to malfunction because of corrosion and electrical shorting. As the electronic packaging becomes denser with fine conductor spacings, the assemblies are even more sensitive to the environmental factors. In addition, the increasing use of electronics in transportation and general industrial applications caused the increased use of conformal coatings, mainly for the protection of the electronics from their harsh end-use environments.

The most damaging and usually the most prevalent contaminant generally is considered to be moisture or humidity. Excessive moisture or humidity will drastically lower insulation resistance between conductors, accelerate high-voltage breakdown and dendritic growth, and corrode conductors. Other contaminants which may damage printed circuit boards include various chemicals such as residues of the manufacturing process, e.g. fluxes, organic solvents, release agents, metal particles and marking inks, and contaminants which inadvertently may be deposited by human handling such as body greases, fingerprints, cosmetics and food stains. Ambient operating conditions may also contribute a variety of contaminants such as salt spray, dirt and dust, oil, fuel, acid, corrosive vapor and fungus. In all but the more severe cases, the destructive action of these contaminants effectively can be eliminated by provision of a good conformal coating.

In addition to providing protection from contaminants, conformal coatings also provide a certain degree of protection to mechanical shock, vibration and tampering.

Historically, the first commercial conformal coatings were one and two-part systems whose main constituents were acrylic, epoxy, silicone or polyurethane resins. These resins were usually dissolved in solvents so they could be applied to the parts by spray, dip or brush. These first generation coatings had one or more disadvantages such as the need for mixing before use and required the use of large amounts of solvents to lower the viscosity for application. They also usually required long drying/curing times that released large amounts of volatile organic compounds (VOC) before the coated assemblies could be handled.

Some of these disadvantages were addressed with the introduction of ultraviolet (UV) curable conformal coatings. The UV curable coatings were generally solventless, one-part systems that cured tack-free to the touch, generally via a free-radical polymerization after exposure to UV light. This allowed immediate handling of the coated parts and so reduced the processing time and energy costs, as compared to the solvent based, thermally cured coatings. The application viscosity of these first generation UV curable coatings tended to be higher than solvent based systems. Also being solventless, the viscosity could not be easily adjusted which makes applying thin films more difficult.

The rapid transformation of a liquid composition into a crosslinked solid happened only to the areas exposed to the UV light and not in the shadowed area (e.g., under components). This shadowing became more of a problem as electronic assemblies with high component densities became more common. Therefore, a secondary cure mechanism such as heat was sometimes incorporated into acrylate, UV curable conformal coatings to polymerize these shadowed areas while maintaining one-part stability. But thermal cure schedules of $\geq 100°$ C. were required to complete this secondary curing process.

Various dual-curing conformal coating systems are known in the art, with each having its advantages and disadvantages.

For instance, two component dual curing systems, such as two component polyurethane systems, offer short curing times. See U.S. Pat. No. 4,424,252 to Nativi et al. In particular, the '252 patent to Nativi discloses a two component system comprising reacting a urethane acrylate with an aliphatic or aromatic polyisocyanate adduct. The coating the cures within 2 hours to a day through several mechanisms, one of which includes reaction between free isocyanates on the polyisocyanate adduct and atmospheric moisture. The curing mechanisms also include reaction between the isocyanate groups and the hydroxyl groups on the urethane acrylate. As a result of the latter reaction, however, this system, as well as other two component systems, e.g. see U.S. Pat. No. 5,013,631 to Su, have a limited pot life (to about 48 hours or less), and thus forces the user to carry out a mixing step just prior to use.

One component systems avoid the pot life problems incurred by the two-component systems in that they avoid including any isocyanate reactive functional groups in the system. See U.S. Pat. No. 4,415,604 to Nativi. For instance, the '604 patent to Nativi discloses a one-component system which comprises an isocyanate-capped polyether diol and triol, an acrylate diluent and a photoinitiator. However, because the isocyanate-capped diols and triols are based on hydrophilic polyethers, the resulting coating loses some hydrolytic stability and resistance to moisture. Thus, in more humid environments, the coating is not as effective.

Another type of dual-curing one-component conformal coating involves a curing mechanism other than an isocyanate reaction. For instance, U.S. Pat. No. 4,451,523 to Nativi et al. discloses a one-component composition comprising a urethane-(meth)acrylate, an allyl-group containing (meth)acrylate monomer, a non-allylic (meth)acrylate diluent, photoinitiator and a metal drier. The crosslinking of the allylic compounds in the presence of metal driers provides the second curing mechanism in addition to UV curing of a (meth)acrylate. However, this system may contribute metal ionic species which reduce the electrical properties of the coating. These species could also cause degradation of electronic components by promoting an electrical pathway between closely packed components.

It is also known to employ dual curing coatings in areas other than electronics. For instance, radiation dual curable coatings have been employed in the automobile industry. See U.S. Pat. No. 4,173,682 to Noomen et al. In particular Noomen et al. disclose a two-component automobile coating system comprising (i) an isocyanate group-containing adduct prepared from a (meth)acrylic hydroxy ester and a polyisocyanate and (ii) a polyfunctional hydroxy compound. However, not only does this two-component system suffer from the disadvantages discussed above in terms of the electronic coatings, it also apparently suffers from long ambient cure times, e.g., a few days, when compared to cure times for other two-component systems. In addition, some of the isocyanates disclosed by Noomen et al., e.g., the adduct of hexamethylene diisocyanate and water, contain biuret linkages. Compounds containing these linkages are not the most thermal or "weather" stable. By "weather stable", it is meant stability under ambient humidity, temperature fluctuations and sunlight.

U.S. Pat. No. 4,138,299 to Bolgiano discloses a one-component dual Curing composition suitable for glossy, abrasion resistant floor coatings. Specifically Bolgiano discloses a one-component composition consisting essentially of an isocyanate (NCO) terminated prepolymer (prepared from an aliphatic isocyanate and a polyester diol and triol), and an acrylate diluent which contains no reactive hydroxyl groups. The NCO terminated prepolymer is also further reacted with sufficient hydroxy acrylate to cap 5 to 15% of the available NCO groups. The composition primarily cures through crosslinking of the acrylates' ethylenically unsaturated groups and secondarily through chain extension and crosslinking of the free NCO groups and water. However, as with the composition disclosed in the '604 patent to Nativi, Bolgiano's composition contains hydrophilic moieties, i.e. the polyester linkages. Accordingly, in humid environments the hydrolytic stability of the composition is not as effective.

As evident from the above discussion and as is well known in the art, no dual curing conformal coating is completely satisfactory for all applications due to the varying processing (e.g. processing speed, pot life and cure conditions) and end use demands (e.g. thermal characteristics, weathering and hydrolytic stability). Accordingly the intended application and the environment related to that application have typically dictated the particular formulation of the coating.

The present invention is a new dual UV/moisture curable conformal coating composition which is a solventless, one-part storage stable, low viscosity liquid that rapidly crosslinks into a tack-free solid when exposure to UV light. This UV cure allows the coated part to be immediately handled and prevents run off of the liquid coating trapped in the shadowed areas. The coating in the shadowed areas is polymerized to a dry-to-the-touch solid upon standing in the open by a reaction with the atmospheric moisture.

An added advantage of the present invention is that it is amendable to varying process demands. For example, it is forgiving of high humidity conditions. That is, its static pot life is somewhat tolerant of ambient moisture and heat in the production environment. The UV cure need not be completed to produce the tack-free surface. Rather, the exposure need only be sufficient to initiate cure. The initial surface tack will be eliminated upon standing. Thus it is possible to decrease the duration and/or intensity of UV exposure of the articles, if desired. The longer cure time and low viscosity of the liquid can contribute to a reduction in product defects. Carbon dioxide can form during the curing step as a byproduct of the polymerization reaction. If the coating cures a bit more slowly and the initial viscosity is low, this gas has more time to diffuse out of the coating instead of forming bubbles. Further, there is more time for inspection and repair of defects in the assemblies during production. Finally, a thinner, more even coating might be obtained.

SUMMARY OF THE INVENTION

It is a specific object of this invention to formulate a dual curing conformal coating composition having application and physical characteristics most suitable for electronic uses. However, the dual curing composition disclosed herein can also be used for other specific uses such as dual curing potting and adhesive compositions.

It is also an object to provide a coating composition having a relatively long pot life and good thermal, weather and hydrolytic stability.

A further object is to provide a means for controlling the cure rate of a conformal coating.

These objects and others which will be apparent from the detailed description below can be obtained from a one part dual curing composition consisting essentially of (a) an isocyanate adduct having (i) free isocyanate groups and (ii) free photopolymerizable ethylenically unsaturated groups, wherein the ethylenically unsaturated groups comprise in the range of 10 to 70% of the total of any free functional groups on said adduct; (b) reactive (meth)acrylate diluents; and (c) optionally, photoinitiator.

To obtain a more thermally stable composition, a one part dual curing composition comprising aliphatic isocyanate trimer having isocyanurate rings can be used.

The composition of this invention can not only be used as a coating on electronic articles, but also other articles as well. Specifically, a composition as described above is applied to the article and then exposed to radiation to provide the primary cure. A second cure results from the reaction of the composition's free isocyanate groups and water.

DETAILED DESCRIPTION

As indicated above, the composition of this invention is a one-component composition. By this term, it is meant that the composition is provided to the user as one formulation which is suitable for immediate use, and is relatively storage stable, e.g. at least thirty days at room temperature. As a result, the one-part composition should consist essentially of (a)–(c) and should be substantially free of any free isocyanate reactive functional groups, e.g. hydroxyl groups. As discussed earlier, two-component systems are provided to the user as two formulations which require a metering and mixing step prior to use. Such compositions are generally not storage stable after mixing.

The isocyanate adduct designated as (a) above is the reaction product of a polyisocyanate and a hydroxyalky (meth)acrylate. As a result of this reaction, (a) not only has free isocyanate groups, but also has free ethylenically unsaturated groups.

Suitable polyisocyanates are those well known in the art. It is preferable that the polyisocyanate has 2 to 3 free isocyanate groups. For applications where appearance of the coating is not critical, suitable aromatic polyisocyanates include, but are not limited to, toluene diisocyanate, diphenylmethane-4,4'-diisocyanate, napthalene diisocyanate, 3,3' bistoluene-diisocyanate and 5,5'-dimethyldiphenylmethane-4,4'-diisocyanate. Adducts of the above-mentioned isocyanates are also suitable.

In applications where the appearance of the coating is critical, aliphatic polyisocyanates are preferred. Suitable aliphatic isocyanates include tetramethylene-1,4-diisocyanate, hexamethylene-1,6-diisocyanate, ω,ω-dipropylether diisocyanate, thiodipropyl diisocyanate, 1,2,4-trimethylhexane-1,6-diisocyanate, 2,4,4-trimethylhexane-1,6-diisocyanate, cyclohexyl-1,4-diisocyanate, isophorone diisocyanate, the adduct of 1 molecule of 1,4-butanediol and 2 molecules of isophorone diisocyanate, the adduct of 1 molecule of 1,4-butanediol and 2 molecules of hexamethylene diisocyanate, dicyclohexylmethane-4,4'-diisocyanate, dicyclohexyldimethylmethane-4,4'-diisocyanate, xylylene diisocyanate, 1,5-dimethyl(2,4-ω-diisocyanatomethyl)benzene, 1,5-dimethyl(2,4-107-diisocyanatoethyl)benzene, 1,3,5-trimethyl(2,4-diisocyanatomethyl)benzene and 1,3,5-triethyl(2,4-ω-diisocyanatomethyl)benzene.

A preferable aliphatic polyisocyanate is a aliphatic isocyanate trimer having an isocyanurate ring. The trimer is preferably the trimerization product of hexamethylene diisocyanate having the structure below:

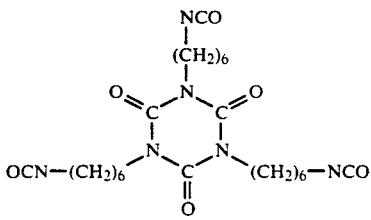

The above polyisocyanate is commercially available as DESMODUR® N-3300 polyisocyanate from Mobay.

Other suitable aliphatic isocyanate trimers include those prepared from isophorone diisocyanate and dicyclohexylmethane diisocyanate.

The aliphatic isocyanate trimers are preferable because conformal coatings prepared therefrom should be more thermal and weather stable than polyisocyanates which contain biuret linkages, e.g. the polyisocyanate suora prepared from hexamethylene diisocyanate and water. See the '682 Patent to Noomen et al. In fact, such trimers would be useful for not only conformal coatings consisting essentially of (a)-(c) mentioned above, but other conformal coatings as well.

The hydroxy alkyl (meth)acrylates suitable for reacting with the polyisocyanate include, but are not necessarily limited to, hydroxyethyl (meth)acrylate, 2-hydroxymethyl (meth)acrylate, hydroxybutyl (meth)acrylate (and isomers thereof) and 2-hydroxypropyl (meth)acrylate (and isomers thereof).

The formation of an adduct from a polyisocyanate and a hydroxy(meth)acrylate may generally be carried out by adding the reaction components together in any arbitrarily chosen way, optionally at elevated temperature. It is preferred that the reaction be carried out under anhydrous conditions at temperatures in the range of 5° to 100° C., more particularly in the range of 50° to 90° C. Generally the reaction components may be added together in any chosen way. However, the hydroxy-alkyl(meth)acrylate be added to the polyisocyanate, in several stages, if desired. The reaction will usually be carried out in the presence of an inert solvent, such as methylisobutyl ketone, toluene, xylene, or esters such as butyl acetate or ethyl glycol acetate, but the use of a solvent is not strictly necessary. Optionally the reaction between the isocyanate groups and the hydroxy groups may be carried out in the presence of a catalyst. Suitable examples of catalysts include tertiary amines and organic tin salts or zinc salts such as dibutyl tin dilaurate, tin octoate and zinc octoate. Mixtures of catalysts may also be used.

As indicated above, the amount of hydroxy alkyl methacrylate is added and the reaction carried out over a sufficient period of time to insure that at least 10% of the free functional groups on (a) are ethylenically unsaturated groups but no more than 70% with preferable amounts being in the range of 20 to 40%. In other words, the amount of hydroxy alkyl (meth)acrylate and the reaction time should be sufficient to terminate at least 10% of the free isocyanate groups on the polyisocyanate, but no more than 70%, with preferably 20 to 40% of the isocyanate groups being terminated.

Once the polyisocyanate adduct has been prepared, it is blended with at least one reactive (meth)acrylate diluent, and preferably two or more. Suitable diluents include those well known in the art and are exemplified by, but not necessarily limited to, isobornyl acrylate, isodecyl acrylate, phenoxyethyl acrylate, dicyclopentenylethoxy methacrylate, and dicyclopentenylethoxy acrylate. Others include trimethylolpropane ethoxylate triacrylate, dicyclopentadiene methacrylate and dicyclopentadiene acrylate, isobutyl methacrylate, and lauryl methacrylate.

The blend can include additives well known in the art. For instance, a photoinitiator or a blend of two or more photoinitiators or photocuring rate accelerators may be added. Suitable photoinitiators include, but are not necessarily limited to, ultraviolet (hereafter "UV") activated free radical generators and typically may be employed in amounts of about 1% to about 10% by weight of the coating composition. For example, the UV activated initiators may be selected from metal carbonyls of the formula $M_x(CO)_y$ wherein M is a metal atom, x is 1 or 2, and y is an integer determined by the total valence of the metal atoms, generally 4 to 10. The preferred UV activated initiators are selected from (a) $C_{1-16}$ straight or branched chain alkyl diones; and (b) carbonyl compounds of the general formula $R^5(CO)R^6$ wherein $R^5$ is a $C_{1-10}$ alkyl, aryl, aralkyl or alkaryl group, and $R^6$ is $R^5$ or hydrogen. In addition, $R^5$ or $R^6$ can contain any substituents which do not adversely affect the compound in serving its function. For example, $R^5$ or $R^6$ can be alpha-substituted with an alkyl, aryl, alkaryl, alkoxy or aryloxy radical, or with an amino or a mono- or dialkylamino derivative thereof, each of the above substituents containing up to about six carbon atoms. In addition, $R^5$ and $R^6$ taken together with carbonyl group(s) form an aromatic or heterocyclic ketone containing up to about 16 carbon atoms.

Specific examples include, but are not limited to, benzophenone, o-methoxy-benzophenone, acetophenone, o-methoxy-acetophenone, acenaphthenequinone, methyl ethyl ketone, valerophenone, hexanophenone, α-phenyl-butyrophenone, p-morpholinopropiophenone, dibenzosuberone, 4-morpholinobenzophenone, benzoin, benzoin methyl ether, 4-o-morpholinodeoxybenzoin, p-diacetylbenzene, 4-aminobenzophenone, 4'-methoxyacetophenone, α-tetralone, 9-acetylphenanthrene, 2-acetylphenanthrene, 10-thioxanthenone, 3-acetylphenanthrene, 3-acetylindole, 9-fluorenone, 1-indanone, 1,3,5-triacetylbenzene, thioxanthen-9-one, xanthene-9-one, 7-H-benz[de]anthracen-7-one, benzoin tetrahydropyranyl ether, 4,4'-bis(dimethylamino)benzophenone, 1'-aoetonaphthone, 2'-acetonaphthone, acetonaphthone and 2,3-butanedione, benz[a]anthracene -7,12-dione, 2,2-dimethoxy-2-phenylacetophenone, α,α-diethoxy-acetophenone, α,α-dibutoxyacetophenone, etc. Singlet oxygen generating photosensitizers such as Rose Bengal, methylene blue, and tetraphenyl porphine may also be employed as photoinitiators. Polymeric initiators include poly(ethylene carbon monoxide) and oligo[2-hydroxy-2-methyl-1-[4-(1-methylvinyl)phenyl]propanone]. Use of a photoinitiator is preferable because it generally provides faster and more efficient initiation. When actinic radiation is used, the initiators may also provide initiation at longer wavelengths which are less costly to generate and less harmful.

It is to be understood, however, that when energy sources, e.g., ionizing radiation, other than visible or ultraviolet light, are used to initiate the curing reaction, photocuring rate accelerators (i.e., photosensitizers, etc.) are not necessarily required in the formulation. As a practical matter, however, these materials are usually needed to produce a commercially feasible process.

It is useful, but also not required, to incorporate an adhesion promoter into the composition when it is used as a coating or an adhesive. Suitable adhesion promoters include those known in the art. Suitable promoters include mono- and dicarboxylic acids which are capable of copolymerizing with the acrylate or methacrylate reactive diluents, well-known silane promoters, organic titanates and organic zirconates. The amount of promoter varies depending on the type used. Suitable amounts can be in the range of 0.01 to 20% of the composition.

Also optional is the inclusion of one or more chelators, crosslinking agents and/or polymerization inhibitors. Chelators and inhibitors are effective in amounts of about 0.1 to about 1% by weight of the total composition. Ethylenediamine tetraacetic acid and its sodium salt (Na4 1,1-ethylenebis-nitril methylidyne dipyridine) and beta-diketones are generally the most effective and are preferred. Cross-linking agents may be present in amounts from about zero to about 10% by weight of the total composition and include compounds such as copolymerizable di(meth)acrylates.

The inhibitor concentration left over in the monomers from manufacture is often high enough for good stability. However, to insure maximum pot life, the proportions mentioned about (about 0.1 to about 1% by weight of the composition) are recommended. Suitable inhibitors include the group consisting of hydroquinones, benzoquinones, naphthoquinones, phenanthraquinones, anthraquinones, and substituted compounds of any of the foregoing. Various phenols can also be employed as inhibitors, the preferred one being p-methoxy phenol. In addition, alkyl or aryl phosphites may be employed, the preferred being triphenyl phosphite and trisodecyl phosphite.

The thickness, viscosity, or thixotropy of the composition can be varied in accordance with the particular application required. Thickeners, plasticizers, diluents, and various other reagents common to the art can be employed in any reasonable manner to produce the desired characteristics.

It is also optional that surfactants be present in the coating system for optimum performance. Suitable surfactants are those well known in the art and are those which are soluble in the coating and are non-reactive with the isocyanate-capped composition. Suitable surfactants include siloxanes and fluorocarbons. Other suitable surfactants include anionic materials such as petroleum sulfonates, sodium alkyl or alkylaryl sulfonates and sulfonated ethoxylated types.

Surfactant concentration will depend upon the particular surfactant and reactive diluent being used. Ordinarily, however, minimum concentration of about 0.25 percent surfactant by weight of the composition will be needed, and a concentration of at least about 0.5 percent usually will be preferred. The maximum surfactant concentration will usually be about the percent since above this level the surfactant may begin to interfere with the properties of the coating and potting system by adversely affecting, for example, its cure rate, stability or the cured products. As a practical matter, an upper concentration limit of about five percent, is usually satisfactory. For most surfactants or combinations of surfactants, the optimum concentration will probably fall in the range of about 1.0 to 2.5 percent by weight of the total composition.

Components (a)-(c) and any optional additives can be blended together simultaneously or the adduct (a) may be blended with the other components using conventional masterbatch techniques.

Once the desired components have been formulated, the one part composition can be applied to articles using conventional dipping, spraying, flood coat, curtain coat and brushing techniques.

The cure is believed to be best accomplished by the UV activation of the photoinitiator(s) that cleave into free radicals which initiates the polymerization of the reactive diluents and the acrylate portion of the oligomer. A high intensity UV radiation source such as a medium pressure mercury arc lamp is the preferred source of the UV light. These high UV intensity light sources are preferred because they have sufficient intensity to overcome the various inhibitive effects found in free radical polymerized systems. These include the stabilizers/inhibitors added to improve storage stability but which tend to retard the bulk cure. The other major inhibitive effect is caused by oxygen in the air acting as a free radical trap that retards the surface cure, especially in thin, acrylate based coatings. The conformal coating of the present invention overcomes any tackfree surface cure problem such as in the partially shadowed areas around components, apparently due to the unique nature of the oligomer used, continued curing initiated by the UV treatment, and its secondary moisture cure. Any mild surface tack should disappear within 24–48 hours at $\geq 50\%$ humidity.

This longer-term cure also polymerizes any of the liquid coating in the shadowed areas such as under components and leads that remain after initial cure.

The liquid coating material is somewhat "forgiving" to moisture exposure such as sometimes found in a production environment. Examples of the static pot life of the coating are illustrated in Example 8 where the coating was exposed to "standard" temperature conditions and at slightly elevated temperatures.

The static pot life of the liquid coating material was found to be most affected by large surface area to volume ratios in the reservoir. This would be expected since the atmospheric moisture diffuses from the exposed surface into the bulk of the coatings. But even at 1 to 3 surface to volume ratio, the liquid material was still usable after seven days at room temperature and 50% relative humidity. Commercial dip tanks typically have to surface ratios volume of greater than 1 to 12 which one would expect to have even longer pot life. An indication of this longer pot life is suggested with the 1 to 8 reservoir kept at 35° C./32% RH that had > 12 days of usable pot life in the reservoir.

As with other isocyanate containing, dual curing compositions, the composition of this invention is cured through two mechanisms. The first cure is obtained by exposing the coating to radiation, preferably UV, to bring about crosslinking of the free ethylenically unsaturated groups. Then through exposure to moisture, preferably atmospheric moisture, crosslinking and chain extension of the free isocyanate groups in the composition occurs. In this manner, the exposed areas of the coating become "dry-to-the-touch", thereby permitting immediate handling of the coated article and maintaining the shape of the coating which might otherwise sag and creep. The secondary cure provides a substantially complete cure of the unexposed areas of the coating under conditions of ambient temperature and humidity.

In instances where the composition of this invention is used as a conformal coating on electronic circuit boards which have various components attached, the "dry-to-the-touch" curing is important in allowing the coated board to be further processed fairly soon after being coated. The secondary cure provides a mechanism for curing the areas of coating which were shadowed from the radiation by the attached components. Articles having surface features which cause similar shadowing problems would also benefit.

In the alternative, a "dry-to-the-touch" cure is not required to ultimately produce a tack-free surface. Acrylate coatings which are UV curable tend to retain a tacky surface if not completely cured. The coating of this invention can be partially cured by exposure to UV. Any mild surface tack disappears within about 24-48 hours. This feature can allow a manufacturer to reduce costs by reducing the time or intensity of the UV treatment.

The coating of this invention also exhibits very good physical properties such as thermal, weather and hydrolytic stability. See Example 6. These features are especially important for electronic circuit board conformal coatings, which, as mentioned earlier, are continuously exposed to solvents, fluxes, handling etc. These properties would also be suitable for other applications for this invention, including, but not limited to, potting compounds and adhesives.

In order to further illustrate the practice of the present invention, the following examples are provided but are in no way meant to be limiting.

EXAMPLE 1

Synthesis of Polyisocyanate Adduct

| Reactants | Weight % | Grams |
|---|---|---|
| DESMODUR ® N-3300[a] | 88.72 | 625.0 |
| Hydroxyethyl acrylate[b] | 10.73 | 75.6 |
| Triphenyl phosphite | 0.50 | 3.5 |

-continued

| Reactants | Weight % | Grams |
|---|---|---|
| p-methoxyphenol | 0.05 | 0.4 |
| Total | 100.00 | 704.5 |

Footnotes:
[a] polyisocyanate (CAS 28182-81-20) from Mobay; based on 5.2 meq isocyanate (NCO)/g by titration (21.8% NCO).
[b] ROCRYL ® 420 hydroxyethyl acrylate (HEA) (CAS 818-6-1) from Rohm and Haas. Based on 8.6 meq hydroxyl (OH)/g with 20% of stoichiometric amount used. Dried over 4A molecular sieves before use.

625 g of DESMODUR ® N-3300 polyisocyanate was charged into a dried liter resin kettle equipped with a glass and teflon paddle stirrer, a stainless steel clad thermocouple, vented additional funnel and dry-air blanket. The polyisocyanate was charged in such a way as to minimize contact with moisture in the air. The polyisocyanate is heated to 45°-50° C. (113° to 122° F.) while stirring at 200 rpm at which time 3.5 g triphenyl phosphite and 0.4 g p-methoxyphenol were added to the kettle. The mixture was stirred five minutes with the kettle temperature allowed to increase to 55° C. (131° F.). The stirrer was increased to 400 rpm and 75.6 g of HEA was then added dropwise via the addition funnel to the reaction mixture over 15 minutes (~5 g/min, average addition rate). The reaction mixture was allowed to exotherm from 55° C. (131° F.) to 65° C. (149° F.) during the HEA addition. After the HEA addition, the mixture temperature was allowed to rise to 85°-90° C. (185°-194° F.) by the exotherm and by additional heating. The mixture was then further stirred at 85°-90° C. (185°-194° F.) until the isocyanate value stabilized at 3.65 to 3.75 meq/q as measured by conventional titration techniques.

The resulting product was a clear to very slightly hazy colorless, somewhat viscous liquid at room temperature. The typical Brookfield RVT viscosity using a 14 spindle and a SC4-6R sample chamber at 25° C. (77° F.) is 11,500 centipoises (cps).

EXAMPLE 2

Conformal Coating Formulations

Two coating formulations, A and B, based on the polyisocyanate/HEA adduct formed in Example 1 were formulated using master batches of (meth)acrylate monomers, photoinitiator and stabilizer. The materials and amounts of the monomer master batches and coatings A and B that were made include the following:

| Components | A Wt % | A Grams | B Wt % | B Grams |
|---|---|---|---|---|
| Monomer Master Batches | | | | |
| SR-506 (isobornyl acrylate)[a] | 38.6 | 320.0 | — | — |
| SR-395 (isodecyl acrylate)[a] | — | — | 32.1 | 257.0 |
| SR-339 (phenoxyethyl acrylate)[a] | 32.2 | 266.0 | 35.6 | 286.0 |
| QM-57 (dicyclopentenylethoxy methacrylate)[b] | 25.9 | 214.0 | — | — |
| QM-672 (dicyclopentenylethoxy acrylate)[b] | — | — | 28.6 | 229.0 |
| Irgacure 651[c] | 3.2 | 26.6 | 3.6 | 28.6 |
| p-methoxyphenol (MEHQ) | 0.1 | 0.6 | 0.1 | 0.8 |
| Total | 100.0 | 827.2 | 100.0 | 801.4 |
| Coatings | | | | |
| Desmodur ® N-3300/HEA | 40.0 | 250.0 | 45.0 | 280.0 |
| Monomer Master Batch A | 60.0 | 375.0 | — | — |

-continued

| Components | A | | B | |
|---|---|---|---|---|
| | Wt % | Grams | Wt % | Grams |
| Monomer Master Batch B | — | — | 55.0 | 342.0 |
| Total | 100.0 | 625.0 | 100.0 | 622.0 |

Footnotes:
*Sartomer Co.
*Röhm and Haas
*Ciba-Geigy

The monomers and MEHQ were charged into an amber glass bottle then shaken together until the MEHQ was dissolved. The IRGACURE® 65i photoinitiator was added and the mixture was shaken for five minutes more until the stabilizer and photoinitiator were dissolved. The monomer master batches were then dried by charging each with 40 g of 4A molecular sieves (8–12 mesh), then allowed to stand in the sealed bottles for about four to six hours.

Two coatings were then formulated in a dry box (<15% relative humidity) to minimize contact with moisture. Contact with air was kept to a minimum. The adduct prepared according to Example 1 was then placed into a dry amber glass or plastic bottle, followed by the correct dried monomer master batch. The mixture was shaken at room temperature for five minutes until the oligomer was dissolved.

Both coatings (A and B) were clear, essentially colorless liquids. The Brookfield viscosities of A and B were each 115 cps. After seven weeks storage in sealed containers, viscosities Were at about 125-130 cps, indicating the formulations were storage stable.

EXAMPLE 3

Cured Coatings

Printed circuit boards (PCB) made from one 28.4 g copper and 1.6 mm core FR-4 with "dummy" surface mount devices (SMD) attached by tin-lead solder were cleaned using methods common to the electronics art. The PCB's were then dip coated with coatings A and B from Example 2 by immersion in a coating bath at a constant rate of 25.4 cm/min., then by withdrawing the coated part at about 10 cm/min.

The coated part was cured by exposure to UV radiation until the coating was dry-to-the-touch. The exposure technique included exposing each of the PCB to the UV using Colight Curing Unit (2×200 watt/in Hg lamps, belt speed of 30 ft/min). Each side (top and bottom) was given a total of 3 passes. The coating under the SMD's remained liquid while the exposed areas were tack-free. These coated, UV cured parts were then placed into a chamber with 100% R. H. for 48 hours then removed to an open room 30% R. H. for 13 days at which time one of the SMD's was removed for "A" and "B" coated boards. In each case the coating under the SMD part was tack-free.

EXAMPLE 4

Approximately 0.8g of each coating A and B from Example 2 in aluminum weighing dishes were placed in chambers maintained at 50% R. H. and 100% R. H. After 72 hours in the 100% R. H. chamber, both coatings were tack-free. The samples kept at 50% R. H. for 144 hours were also tack-free.

EXAMPLE 5

Accelerated Moisture Cure

An accelerated moisture cure was conducted by adding 0.15 g of a 1% (by wt.) solution of dibutyltin dilaurate in isodecyl acrylate to 15 g each of coating A and B. The moisture cures of those mixtures were tested in the same way as in Example 4. Both of these mixtures containing the dibutyltin dilaurate were clear solids after 24 hours at 50% and i00% R. H. and were tack-free within 48 to 72 hours. When the moisture cure was tested at 30% R. H. both of these mixtures were tack-free after 48 hours while the coatings without the tin compound remained liquid. After 30 days storage in sealed plastic bottles, the viscosity of this composition went from 125 cps to 140 cps at 25° C.

EXAMPLE 6

Properties of Cured Coating

Tests for the following properties were conducted on cured conformal coatings prepared according to Example 2 and cured by a method similar to the method described in Example 3, except that the method included techniques according to MIL-I-46058C. Specifically, the coated test specimens (coupons) were dip-coated at a 10 cm/minute immersion and withdrawal rate and were cured by UV using four passes per side. After being cured, the specimens were placed in a humidity chamber (100% R. H.) for seventy-two hours. They were then removed and placed in an open room for at least twenty-four hours before testing. Both A and B passed the tests.

(i) Chemical Resistance: as measured by rubbing back and forth (1 double rub) a cotton swab soaked in methyl ethyl ketone across the coated specimen; the same test was again performed using a swab soaked in a mixture of freon and isopropyl alcohol; both A and B endured 100 double rubs for each solvent.

(2) Thermal Shock: as substantially measured by Military Specification MIL-I-46058C; both A and B passed fifty cycles of alternating exposure to −55° C. and 125° C., with 17 cycles at −55° C. to 125° C. and 33 cycles at −65° C. to 125° C.

(3) Moisture Resistance: as measured by Military Specification MIL-I-46058C; both A and B exhibited insulation resistance measurements of at least or greater than $10^{10}$ Ohms before, during and after the test which involves testing resistance under electrical load and under high humidity (90–95% R. H.) and temperatures of 25° C. to 65° C.

(4) Dielectic Withstanding Voltage: as measured by Military Specification MIL-I-46058C; both A and B passed this test by having no disruptive discharge under test voltage of 1500 volts of alternating current at 60 hertz and with a current leakage of less than 10 microamperes.

(5) Insulation Resistance: as measured by Military Specification MIL-I-46058C and which was used as the insulation resistance prior to the moisture resistance test described in (3) above; both A and B passed having an insulation resistance of $2.0 \times 10^{14}$ Ohms.

EXAMPLE 7

Alternative Curing Method

Thin films of the present invention have the ability to cure a tack-free surface after a partial ultraviolet (UV)

cure that leaves the coating surface still tacky. This ability of the tacky surface of the coating to become tack-free to the touch is believed to be possible via continued curing initiated by the UV treatment, or a secondary moisture cure mechanism such as described in Examples 3 and 4.

Formulation B of Example 2 was drawn down on the Hegman gauge with 0 to 25 μm deep groove (~0.5 in. wide × ~6 in. long) so that groove was filled with the formulation. The gauge was passed through a Colight UV Curing Unit for four passes at 30 ft/min. The coating was tack-free in 25 microns to ~10 micron/area of the Hegman gauge. The ~micron think to 0 micron thick areas of the coating remained tacky. The gauge with the UV exposed coating placed into a 95–100% relative humidity chamber for 24 hours at which time the area of the coating that was tacky after UV exposure was tack-free to the touch.

EXAMPLE 8

Static Pot Life

Composition "B" from Example 2 was placed in the following plastic containers all kept open (no lids).

| Surface/Volume Ratio | Dimensions | Amount |
|---|---|---|
| 1:3 | 2.75 in. dia. × 3" h | 230 g |
| 1:3.5 | 1.4 in. dia. × 3" h | 110 g |
| 1:8 | 1.4 in. dia. × 8" h | 100 g |

A set was placed in 24° C./50% relative humidity chamber and the other set placed in a 35° C./32% R. H. chamber. Samples of each removed and measured on a Brookfield RVT viscometer at 25° C.

| Test Conditions | Surface area to volume ratios | | |
|---|---|---|---|
| | 1:3 Viscosity @ 25° C. | 1:3.5 Viscosity @ 25° C. | 1:8 Viscosity @ 25° C. |
| 24° C./50% R.H. | | | |
| 0 days | 110 cp | 110 cp | 110 cp |
| 3 days | 115 | NA | NA |
| 7 days | 140 | 125 | NA |
| 35° C./32% R.H. | | | |
| 0 days | 110 cp | 110 cp | 110 cp |
| 3 days | 115 (5%) | NA | NA |
| 7 days | 165 | 165 | 125 |
| 12 days | Gelled | Gelled | 150 |

What is claimed:

1. A one-part dual curing composition consisting essentially of
   (a) an isocyanate aduct which is the reaction product of an aliphatic isocyanate trimer having an isocyanurate ring and a hydroxyalkyl (meth)acrylate having (i) free isocyanate groups and (ii) free photopolymerizable ethylenically unsaturated groups, wherein the ethylenically unsaturated groups comprise in the range of 10 to 70% of the total of any free functional groups on said adduct;
   (b) reactive (meth)acrylate diluents; and
   (c) optionally, photoinitiator.

2. A composition according to claim 1 wherein said isocyanate trimer is a trimerization product of hexamethylene diisocyanate.

3. A composition according to claim 1 wherein the free ethylenically unsaturated groups comprise about 20% of the total number of free functional groups on said adduct.

* * * * *